US012610725B2

(12) United States Patent
Seo et al.

(10) Patent No.: US 12,610,725 B2
(45) Date of Patent: Apr. 21, 2026

(54) DISPLAY DEVICE WITH LIGHT BLOCKING PATTERNS AND MANUFACTURING METHOD THEREOF

(71) Applicant: Samsung Display Co., LTD., Yongin-si (KR)

(72) Inventors: Kab Jong Seo, Yongin-si (KR); Tae Wook Kang, Yongin-si (KR); Jun Ho Sim, Yongin-si (KR); Jae Hun Lee, Yongin-si (KR); Yang-Ho Jung, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 371 days.

(21) Appl. No.: 18/326,221

(22) Filed: May 31, 2023

(65) Prior Publication Data

US 2024/0122048 A1 Apr. 11, 2024

(30) Foreign Application Priority Data

Oct. 11, 2022 (KR) ......................... 10-2022-0129966

(51) Int. Cl.
*H10K 59/80* (2023.01)
*H10K 71/20* (2023.01)
(52) U.S. Cl.
CPC ....... *H10K 59/8792* (2023.02); *H10K 71/231* (2023.02)
(58) Field of Classification Search
None
See application file for complete search history.

(56) References Cited

U.S. PATENT DOCUMENTS

| | | | | |
|---|---|---|---|---|
| 2021/0074770 A1* | 3/2021 | Choe | ...................... | G02B 5/206 |
| 2021/0320150 A1* | 10/2021 | Yang | ................... | H10K 59/871 |
| 2022/0336781 A1* | 10/2022 | Hong | ...................... | H10K 59/40 |

FOREIGN PATENT DOCUMENTS

| | | |
|---|---|---|
| KR | 10-1296899 | 8/2013 |
| KR | 10-1546554 | 8/2015 |
| KR | 10-2021-0079467 | 6/2021 |
| KR | 10-2022-0003407 | 1/2022 |

* cited by examiner

*Primary Examiner* — Daniel Whalen
(74) *Attorney, Agent, or Firm* — F. CHAU & ASSOCIATES, LLC

(57) ABSTRACT

A display device includes a light-emitting device disposed on a substrate and including an emission layer, and a light controller disposed on the light-emitting device. The light controller includes a plurality of main light blocking patterns extending in a first direction and spaced apart from each other in a second direction intersecting the first direction, and a plurality of sub-light blocking patterns disposed between adjacent ones of the plurality of main light blocking patterns, extending in the first direction, and spaced apart from each other in the second direction. Each of the plurality of main light blocking patterns has a first thickness in a thickness direction of the substrate, and each of the plurality of sub-light blocking patterns has a second thickness that is less than the first thickness in the thickness direction of the substrate.

17 Claims, 19 Drawing Sheets

DISPLAY DEVICE WITH LIGHT BLOCKING PATTERNS AND MANUFACTURING METHOD THEREOF

CROSS-REFERENCE TO RELATED APPLICATION(S)

This application claims priority to and the benefits of Korean Patent Application No. 10-2022-0129966 under 35 U.S.C. § 119, filed on Oct. 11, 2022, in the Korean Intellectual Property Office (KIPO), the entire contents of which are incorporated herein by reference.

BACKGROUND

1. Technical Field

The disclosure relates to a display device including a light controller for controlling a viewing angle, and a manufacturing method.

2. Description of the Related Art

Display devices display images, and include a liquid crystal display (LCD), an organic light emitting diode (OLED) display, a quantum dot light emitting diode (QLED) display, and a micro LED display.

The display devices are used in electronic devices such as mobile phones, GPS, digital cameras, electronic books, portable gaming devices, and various terminals. Further, the display device may be used in various fields in addition to the electronic devices, and recently researches on display devices for vehicles using organic light emitting elements are in progress.

A light control film (LCF) for controlling reflected images by blocking light transmitting to a windshield of a vehicle is provided to the display device for a vehicle, for safety of a driver.

The above information disclosed in this Background section is only for enhancement of understanding of the background of the disclosure, and therefore it may contain information that does not form the prior art that is already known in this country to a person of ordinary skill in the art.

SUMMARY

The disclosure has been made in an effort to provide a display device including a light controller for controlling a viewing angle by blocking light emitted by the display device to a specific direction, and a manufacturing method.

The disclosure has been made in another effort to control a viewing angle so that privacy of a user may not be exposed.

The disclosure has been made in another effort to prevent light emitted by a display device used for a vehicle from being reflected by a windshield of the vehicle and hindering a view of a driver.

The disclosure has been made in another effort to provide a method for manufacturing a light controller for controlling a viewing angle provided by a display device.

According to an embodiment, a display device may include a light-emitting device disposed on a substrate and including an emission layer, and a light controller disposed on the light-emitting device. The light controller may include a plurality of main light blocking patterns extending in a first direction and spaced apart from each other in a second direction intersecting the first direction, and a plurality of sub-light blocking patterns disposed between adjacent ones of the plurality of main light blocking patterns, extending in the first direction, and spaced apart from each other in the second direction. Each of the plurality of main light blocking patterns may have a first thickness in a thickness direction of the substrate, and each of the plurality of sub-light blocking patterns may have a second thickness that is less than the first thickness in the thickness direction of the substrate.

The first thickness may be equal to or greater than twice the second thickness.

The plurality of main light blocking patterns may be spaced apart from each other by a first distance, the plurality of sub-light blocking patterns may be spaced apart from each other by a second distance, and the first distance may be greater than the second distance.

A distance between an upper surface of the emission layer and a bottom surface of each of the plurality of sub-light blocking patterns may be greater than a distance between the upper surface of the emission layer and a bottom surface of each of the plurality of main light blocking patterns.

A number of the plurality of sub-light blocking patterns may be greater than a number of the plurality of main light blocking patterns.

At least one of the plurality of main light blocking patterns and the plurality of sub-light blocking patterns may include at least one of $MoTaO_x$, $AlO_x$, $CrO_x$, $CuO_x$, $MoO_x$, $TiO_x$, $AlNdO_x$, $CuMoO_x$, and $MoTiO_x$.

According to an embodiment, a display device may include a light-emitting device disposed on a substrate and including an emission layer, and a light controller disposed on the light-emitting device. The light controller may include a first layer including a plurality of first light blocking patterns extending in a first direction and spaced apart from each other by a first distance in a second direction intersecting the first direction, a second layer disposed on the first layer and including a plurality of second light blocking patterns extending in the first direction and spaced apart from each other by a second distance in the second direction, and a third layer disposed on the second layer and including a plurality of third light blocking patterns extending in the first direction and spaced apart from each other by a third distance in the second direction. At least one of the first distance, the second distance and the third distance may be different from another one of the first distance, the second distance, and the third distance.

The display device may further include a first transparent organic film disposed on the emission layer between the plurality of first light blocking patterns, a second transparent organic film disposed on the first transparent organic film between the plurality of second light blocking patterns, and a third transparent organic film disposed on the second transparent organic film between the plurality of third light blocking patterns.

At least a part of the plurality of second light blocking patterns may overlap at least a part of the plurality of first light blocking patterns and at least a part of the plurality of third light blocking patterns in a plan view.

The second distance may be less than the first distance.

The third distance and the first distance may be equal.

A thickness of the second transparent organic film may be less than a thickness of the first transparent organic film in a thickness direction of the substrate.

According to an embodiment, a method for manufacturing a display device may include providing a first layer including first transparent organic films and a plurality of first light blocking patterns disposed between the first transparent organic films on an encapsulation layer of a substrate, providing a second layer including second transparent organic films and a plurality of second light blocking patterns disposed between the second transparent organic films on the first layer, and providing a third layer including third transparent organic films and a plurality of third light blocking patterns disposed between the third transparent organic films on the second layer. At least one of a first distance between adjacent ones of the plurality of first light blocking patterns, a second distance between adjacent ones of the plurality of second light blocking patterns, and a third distance between adjacent ones of the plurality of third light blocking patterns may be different from another one of the first distance, the second distance, and the third distance.

The method may further include providing an inorganic layer on the first layer before the providing of the second layer.

The providing of the first layer may include providing the first transparent organic films by applying and patterning a transparent organic material, applying a light blocking material on the first transparent organic films, forming the plurality of first light blocking patterns by dry etching the light blocking material, and filling a space between the plurality of first light blocking patterns with the transparent organic material.

At least a part of the plurality of second light blocking patterns may overlap at least a part of the plurality of first light blocking patterns and at least a part of the plurality of third light blocking patterns in a plan view.

Each of the plurality of first light blocking patterns may overlap one of the plurality of third light blocking patterns in a plan view.

The second distance may be less than the first distance.

The third distance and the first distance may be equal.

A thickness of each of the second transparent organic films may be less than a thickness of each of the first transparent organic films in a thickness direction of the substrate.

According to embodiments, a display device including a light controller for protecting privacy of a user by controlling a viewing angle may be provided. Further, the light emitted by the display device for a vehicle may be prevented from being transmitted to a windshield of a vehicle so that the light reflected by the windshield of the vehicle may not hinder the view of the driver.

According to embodiments, a method for manufacturing a thick transparent organic film configuring a light controller and reducing the gap between the light blocking patterns may be provided.

DETAILED DESCRIPTION OF THE EMBODIMENTS

Figure 1:
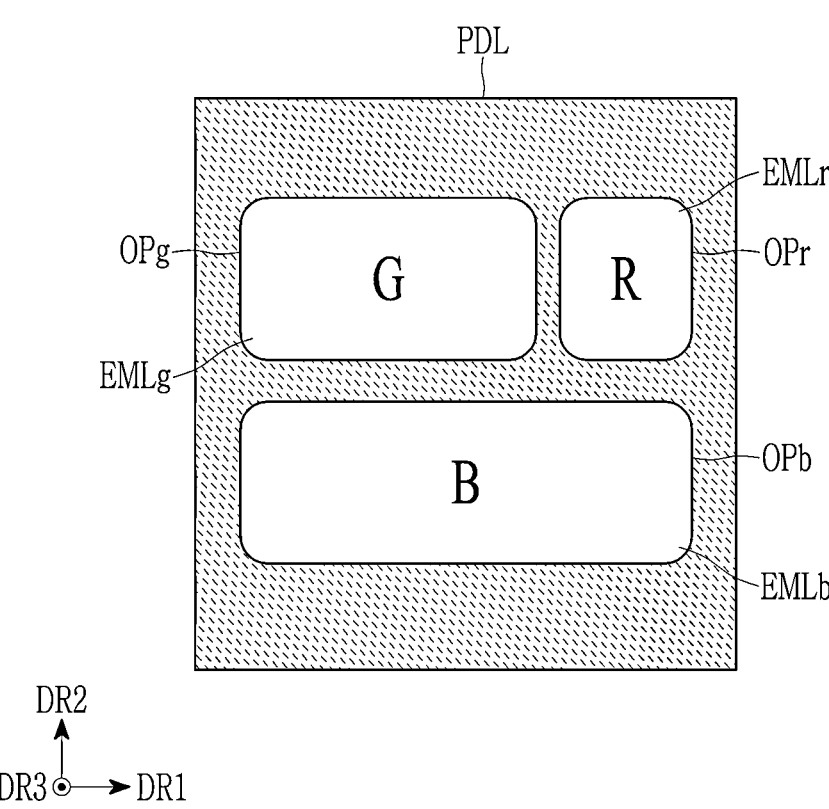
FIG. 1 shows a top plan view of a pixel of a display device according to an embodiment.

The disclosure will be described more fully hereinafter with reference to the accompanying drawings, in which embodiments of the disclosure are shown. As those skilled in the art would realize, the described embodiments may be modified in various different ways, all without departing from the spirit or scope of the disclosure.

Parts that are irrelevant to the description will be omitted to clearly describe the disclosure, and the same elements will be designated by the same reference numerals throughout the specification.

In the drawings, the thickness of layers, films, panels, regions, etc., are enlarged for clarity. The thicknesses of some layers and areas are exaggerated for ease of description.

It will be understood that when an element such as a layer, film, region, or substrate is referred to as being "on" another element, it can be directly on the other element or intervening elements may also be present. In contrast, when an element is referred to as being "directly on" another element, there are no intervening elements present. The word "on" or "above" means disposed on or below the object portion, and does not necessarily mean disposed "on" or "above" the upper side of the object portion based on a gravitational direction.

Unless explicitly described to the contrary, the word "comprise", and variations such as "comprises" or "comprising", will be understood to imply the inclusion of stated elements but not the exclusion of any other elements.

The phrase "in a plan view" means viewing a target portion from the top, and the phrase "in a cross-sectional view" means viewing a cross-section formed by vertically cutting a target portion from the side.

Throughout the specification, when an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements.

For the purposes of this disclosure, "at least one of A and B" may be construed as A only, B only, or any combination of A and B. Also, "at least one of X, Y, and Z" and "at least one selected from the group consisting of X, Y, and Z" may be construed as X only, Y only, Z only, or any combination of two or more of X, Y, and Z. As used herein, the term "and/or" includes any and all combinations of one or more of the associated listed items.

When the parts such as wires, layers, films, regions, plates, or constituent elements are described to extend in the "first direction or the second direction", this not only signifies a straight-line shape running straight in a corresponding direction, but also includes a structure generally extending in the first direction or the second direction, a structure bent on a portion, a zigzag-shaped structure, or a structure including a curved structure and extending.

The display device may display images in a third direction DR3 on a plane defined by a first direction DR1 and a second direction DR2. The directions indicated by the first to third directions DR1, DR2, and DR3 are not limited to three axes of a rectangular coordinate system, such as the x, y, and z axes, and may be interpreted in a broader sense. For example, the first to third directions DR1, DR2, and DR3 may be perpendicular to one another, or may represent different directions that are not perpendicular to one another.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

Figure 2:
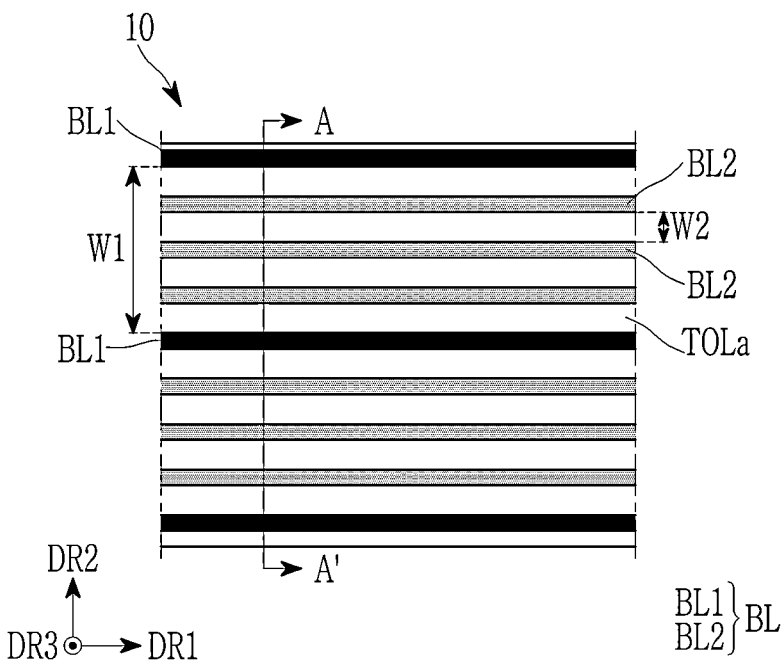
FIG. 2 shows a top plan view of a light controller provided on a display device according to an embodiment.
Figure 3:
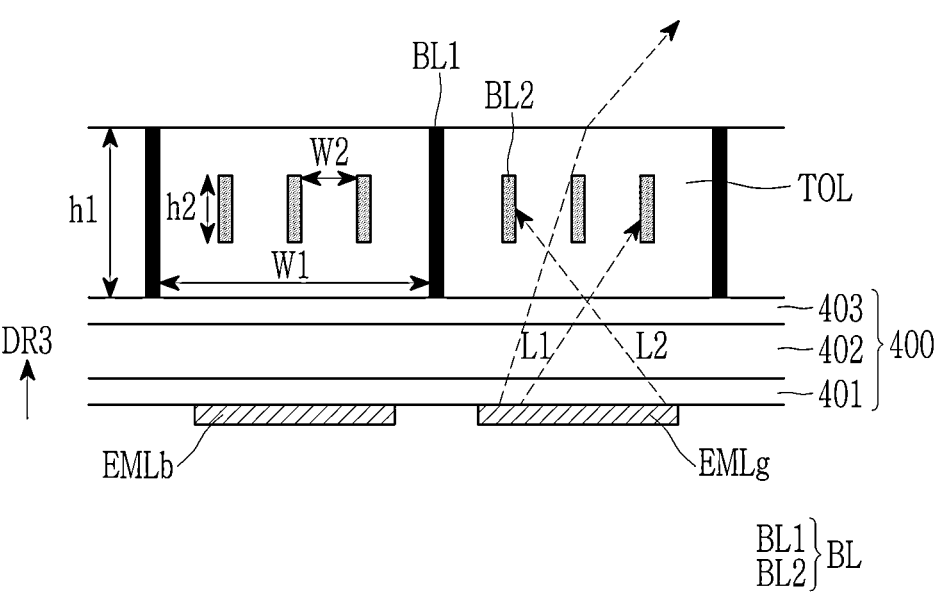
FIG. 3 shows a schematic cross-sectional view of a light controller of FIG. 2 along line A-A'.

FIG. 1 shows a top plan view of a pixel of a display device according to an embodiment, FIG. 2 shows a top plan view of a light controller according to an embodiment, and FIG. 3 shows a schematic cross-sectional view along line A-A' of FIG. 2.

FIG. 1 shows three adjacent light-emitting devices displaying different colors of red, green, and blue R, G, and B, and the respective light-emitting devices include emission layers EMLr, EMLg, and EMLb.

The emission layers EMLr, EMLg, and EMLb may correspond to light emitting portions of the light-emitting devices, and may be partitioned by a pixel defining layer PDL. The emission layers EMLr, EMLg, and EMLb may overlap respective openings OPr, OPg, and OPb disposed in the pixel defining layer PDL in a plan view, and at least part of the emission layers EMLr, EMLg, and EMLb may not overlap the pixel defining layer PDL and may be exposed in a plan view. Depending on embodiments, the emission layers EMLr, EMLg, and EMLb may be disposed in the respective openings OPr, OPg, and OPb of the pixel defining layer PDL. Although not shown in FIG. 1, a cathode and an encapsulation layer may be disposed above the pixel defining layer PDL and the emission layers EMLr, EMLg, and EMLb, and an anode may be disposed below the respective emission layers EMLr, EMLg, and EMLb. One anode, one of the emission layers EMLr, EMLg, and EMLb, and one cathode may configure one light-emitting device.

FIG. 2 shows a planar structure of a light controller 10 according to an embodiment.

The light controller 10 may include multiple light blocking patterns BL. The light blocking patterns BL may include a light absorbing material and may control a user's viewing angle of an image.

The light blocking patterns BL may include multiple main light blocking patterns BL1 and multiple sub-light blocking patterns BL2. The main light blocking patterns BL1 and the sub-light blocking patterns BL2 may extend in the first direction DR1, and may be arranged at regular intervals in the second direction DR2 intersecting the first direction DR1.

The main light blocking patterns BL1 may be spaced apart from each other by a first distance W1 in the second direction DR2, and the sub-light blocking patterns BL2 may be spaced apart from each other by a second distance W2 in the second direction DR2 between the main light blocking patterns BL1. The second distance W2 between the sub-light blocking patterns BL2 may be less than the first distance W1 between the main light blocking patterns BL1. For example, without considering the width of the light blocking patterns BL, the first distance W1 may be a multiple of the second distance W2. A distance between the main light blocking pattern BL1 and the adjacent sub-light blocking pattern BL2 may be the second distance W2.

The light blocking pattern BL may include a light blocking material. The light blocking material may be a light absorbing material, and light absorbing materials used by a person ordinary skilled in the art may be used. For example, a dark colored pigment such as a black pigment or a gray pigment, a dark colored dye, a metal such as aluminum or silver, a metal oxide, or a dark colored polymer may be used as the light absorbing material. The light blocking material for forming the light blocking pattern BL may be a light absorbing material, and any types of materials that may be thinly deposited may be used for the light blocking material. For example, the light absorbing material may include a metal oxide such as $MoTaO_x$, $AlO_x$, $CrO_x$, $CuO_x$, $MoO_x$, $TiO_x$, $AlNdO_x$, $CuMoO_x$, or $MoTiO_x$. The light blocking pattern BL may include MTO ($MoTaO_x$).

A transparent organic film TOL may be disposed in a region in which light blocking patterns BL are not provided. The transparent organic film TOL may transmit light transmitted by the light-emitting device and may emit the light to an outside, and may include a transparent resin. For example, the transparent organic film TOL may include an organic material such as a general-purpose polymer including poly(methyl methacrylate) (PMMA) and polystyrene (PS), a polymer derivative having a phenol-based group, an acryl-based polymer, an imide-based polymer such as a polyimide, a siloxane-based polymer, or a cardo-based polymer.

The light controller 10 may include multiple light blocking patterns BL extending in the first direction DR1 and arranged at regular intervals in the second direction DR2 intersecting the first direction in a plan view and a transparent organic film TOL disposed between the light blocking patterns BL, and may be disposed on the display panel including the light-emitting device as shown in FIG. 1.

FIG. 3 shows a schematic cross-sectional view of a light controller of FIG. 2 along line A-A'. In an embodiment, the light-emitting device having the arrangement shown in FIG. 1 may be disposed under the light controller 10 including light blocking patterns BL and transparent organic films TOL as shown in FIG. 2.

Referring to FIG. 3, an encapsulation layer 400 may be disposed below the transparent organic film TOL, and the encapsulation layer 400 may include a lower inorganic encapsulation film 401, an organic encapsulation film 402, and an upper inorganic encapsulation film 403. The light-emitting device may be disposed under the encapsulation layer 400. A general stacked structure of the display panel including the light-emitting device will be described below with reference to FIG. 16.

FIG. 3 schematically shows the emission layers EMLb and EMLg, and a principle of transmitting and blocking light with reference to the green emission layer EMLg will now be described.

In case that the light-emitting device emits light, it means the emission layer EMLg emits light, and the light emitted by the emission layer EMLg may be emitted in many directions. The light emitted in many directions may be transmitted within an angle because of the light blocking pattern BL disposed on the emission layer EMLg. As a result, the viewing angle of the emissive display device may be controlled.

The viewing angle of the display device may be controlled according to a distance between the light blocking pattern BL and the emission layer EMLg, a distance between adjacent light blocking patterns BL, a thickness of the transparent organic film TOL, and a width and a thickness of the light blocking pattern BL. For example, in case that a thickness of the transparent organic film TOL increases or a distance between light blocking patterns BL reduces, a viewing angle may be reduced, and a lateral light blocking rate may be increased.

Referring to FIG. 3, the main light blocking patterns BL1 may be arranged at the intervals of the first distance W1, and the sub-light blocking patterns BL2 may be arranged at the intervals of the second distance W2 between the main light blocking patterns BL1.

The main light blocking patterns BL1 may have a first thickness h1 in the thickness direction DR3 of the display device, and the sub-light blocking patterns BL2 may have a second thickness h2 in the thickness direction DR3 of the display device. The first thickness h1 of the main light blocking patterns BL1 may be greater than the second thickness h2 of the sub-light blocking patterns BL2, for example, the first thickness h1 may be equal to or greater than twice the second thickness h2.

Further, as shown in FIG. 3, a distance in the third direction DR3 from upper surfaces of the emission layers EMLb and EMLg to a bottom surface of the sub-light blocking pattern BL2 may be greater than a distance in the third direction DR3 from the upper surfaces of the emission layers EMLb and EMLg to a bottom surface of the main light blocking pattern BL1. A transparent organic film TOL may be disposed between the sub-light blocking patterns BL2 and the upper inorganic encapsulation film 403. For example, a thickness of the transparent organic film TOL disposed between the upper surface of the inorganic encapsulation film 403 and the lower surface of the sub-light blocking patterns BL2 may be greater than a thickness of the sub-light blocking pattern BL2 in the third direction DR3.

As the sub-light blocking patterns BL2 are disposed between the main light blocking patterns BL1, a distance between the light blocking patterns BL may be reduced, and a viewing angle may be efficiently controlled. For example, light L1 and L2 emitted by the emission layer EMLg could pass through an upper surface of the transparent organic film TOL to a side without a sub-light blocking pattern BL2. However, according to an embodiment, as shown in FIG. 3, the light L2 may be absorbed by the sub-light blocking pattern BL2 disposed between the main light blocking patterns BL1 and may not be transmitted to the outside. Accordingly, the viewing angle of the user may be controlled. A detailed result of the light emitting simulation by the light controller will be described below with reference to FIG. 13 and FIG. 14.

A method for manufacturing a light controller according to an embodiment will now be described with reference to FIG. 4 to FIG. 12.

To control a viewing angle, a method for increasing the thickness of the transparent organic film TOL or reducing the distance between the light blocking patterns BL may be considered. However, two methods for blocking the viewing angle, that is the method of increasing the thickness of the transparent organic film and the method of reducing a pattern gap of the light blocking pattern may have a trade-off relationship with each other. For example, in case that a thickness of the transparent organic film TOL increases, an etching processability may be reduced, and it may be difficult to perform a fine patterning for reducing the pattern gap of the light blocking patterns BL. To perform the fine patterning for reducing the distance between the light blocking patterns BL, it may need to reduce the thickness of the transparent organic film TOL to increase resolution of exposure.

A method for manufacturing a light controller according to an embodiment of the disclosure may provide a new method for increasing the thickness of the transparent organic film TOL and reducing the pattern gaps between the light blocking patterns BL.

FIG. 4 to FIG. 12 are schematic cross-sectional views sequentially illustrating a method for manufacturing a light controller of a display device according to an embodiment.

FIG. 4 to FIG. 12 illustrate some of the layers disposed under the light controller and illustrate only the upper inorganic encapsulation film 403 of the encapsulation layer 400.

Figure 4:
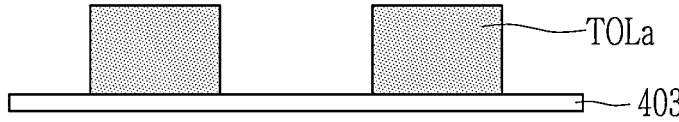
FIG. 4 to FIG. 12 are schematical cross-sectional views sequentially illustrating a method for manufacturing a light controller according to an embodiment.

Referring to FIG. 4, a transparent organic material may be applied on the upper inorganic encapsulation film 403, and the transparent organic material may be patterned by using a photolithography process to form a first transparent organic film TOLa pattern. The first transparent organic films TOLa may have a width and extend in a direction, and adjacent first transparent organic films TOLa may be spaced from each other by a distance. The width of the first transparent organic film TOLa and the distance between the first transparent organic films TOLa may be substantially the same.

Figure 5:
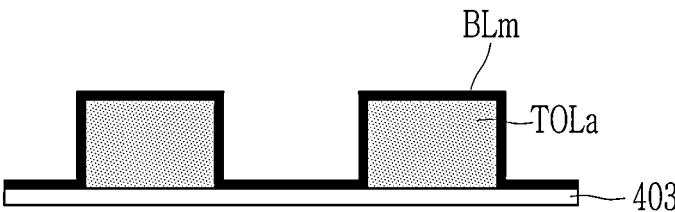

As shown in FIG. 5, a light blocking material layer BLm for blocking light may be thinly applied along the pattern of the first transparent organic film TOLa. The light blocking material may include a light absorbing material. The light absorbing material may include a metal oxide such as $MoTaO_x$, $AlO_x$, $CrO_x$, $CuO_x$, $MoO_x$, $TiO_x$, $AlNdO_x$, $CuMoO_x$, or $MoTiO_x$. For example, the light blocking material layer BLm may include MTO ($MoTaO_x$).

Figure 6:
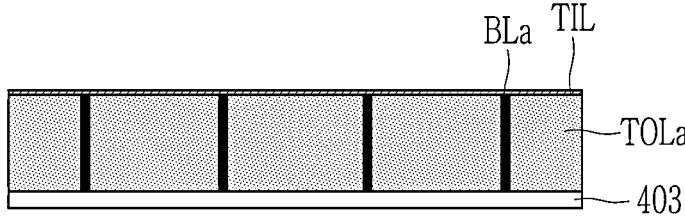

As shown in FIG. 6, by using a dry etching, the light blocking material layer BLm disposed on upper surfaces of the first transparent organic films TOLa and the upper inorganic encapsulation film 403 may be etched and the light blocking material layer BLm disposed on side surfaces of the first transparent organic films TOLa may be unetched to thus form first light blocking patterns BLa.

A transparent organic material may be filled in a space between the first light blocking patterns BLa corresponding to the intervals between the first transparent organic films TOLa shown in FIG. 5 to thus complete the first layer. For example, the first layer may include first light blocking patterns BLa extending in a direction and disposed at intervals of a distance (first distance) in a direction intersecting the extending direction, and a first transparent organic film TOLa disposed between the first light blocking patterns BLa.

An inorganic insulating material such as a silicon oxide ($SiO_x$) or a silicon nitride ($SiN_x$) or a transparent conductive oxide (TCO) such as an ITO or an IZO may be thinly applied on the first layer to form a transparent inorganic film TIL. The transparent inorganic film TIL may act as an etch stopper for preventing a first layer from being damaged in a process for etching the organic film on a second layer or the light blocking pattern.

Figure 7:
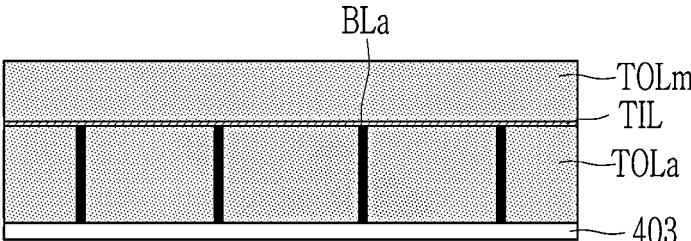

Referring to FIG. 7, a transparent organic material TOLm for forming a second layer may be applied on the transparent inorganic film TIL provided on the first layer. A thickness of the transparent organic material layer TOLm provided on the second layer may be less than a thickness of the first transparent organic film TOLa of the first layer in the thickness direction of the upper inorganic encapsulation film 403.

Figure 8:
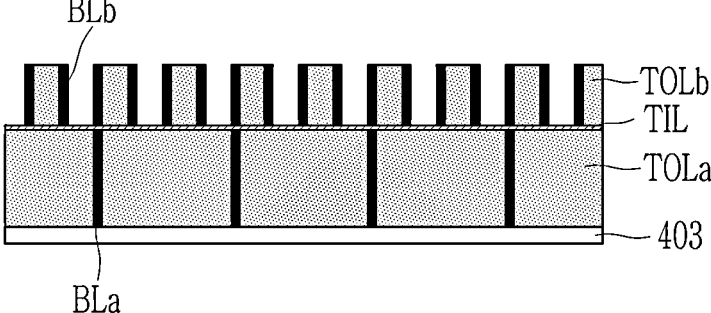

As shown in FIG. 8, the transparent organic material layer TOLm provided on the second layer may be patterned by using the photolithography process, to thus form a second transparent organic film TOLb pattern. Second transparent organic films TOLb may have a width and extend in a direction, and adjacent second transparent organic films TOLb may be spaced from each other by a distance. The width of the second transparent organic film TOLb and a distance between second transparent organic films TOLb may be substantially the same.

As the transparent organic material layer TOLm provided on the second layer is thinner than the transparent organic material layer of the first layer for forming the first transparent organic film TOLa, the transparent organic material layer of the second layer may be fine patterned more readily than the transparent organic material layer of the first layer. Hence, the distance between the second transparent organic films TOLb may be less than the distance between the first light blocking patterns BLa.

The light blocking material layer for blocking light may be thinly applied along the pattern of the second transparent organic film TOLb, and a dry etching may be performed to form multiple second light blocking patterns BLb on side surfaces of the second transparent organic film TOLb. The light blocking material may include a light absorbing material. The light absorbing material may include a metal oxide such as $MoTaO_x$, $AlO_x$, $CrO_x$, $CuO_x$, $MoO_x$, $TiO_x$, $AlNdO_x$, $CuMoO_x$, or $MoTiO_x$. For example, the light blocking material layer may include MTO ($MoTaO_x$).

As shown in FIG. 8, some of the second light blocking patterns BLb may overlap the first light blocking pattern BLa in a plan view to be coplanar with the first light blocking pattern BLa.

Figure 9:
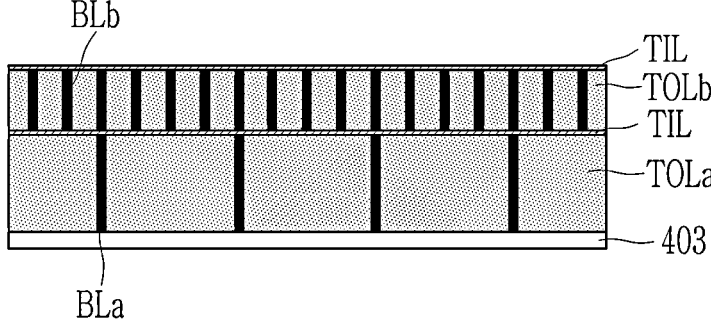

Referring to FIG. 9, a transparent organic material may be filled in a space between the second light blocking patterns BLb corresponding to the intervals between the second transparent organic films TOLb shown in FIG. 8 to thus complete the second layer. For example, the second layer may include second light blocking patterns BLb extending in a direction and disposed at intervals of a distance (second distance) in a direction intersecting the extending direction, and a second transparent organic film TOLb disposed between the second light blocking patterns BLb.

The second layer may be thinner than the first layer in the thickness direction of upper inorganic encapsulation film 403, and the distance (second distance) between the second light blocking patterns BLb may be less than the distance (first distance) between the first light blocking patterns BLa. Some of the second light blocking patterns BLb may overlap the first light blocking pattern BLa in a plan view to be coplanar the first light blocking pattern BLa.

An inorganic insulating material such as a silicon oxide ($SiO_x$) or a silicon nitride ($SiN_x$) or a transparent conductive oxide (TCO) such as an ITO or an IZO may be thinly applied on the second layer to form a transparent inorganic film TIL. The transparent inorganic film TIL may act as an etch stopper for preventing the second layer from being damaged in a process for etching the organic film on a third layer or the light blocking pattern.

Figure 10:
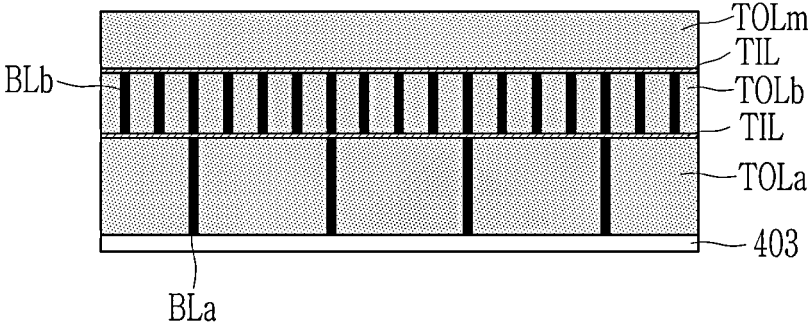

Referring to FIG. 10, a transparent organic material TOLm for forming a third layer may be applied on the transparent inorganic film TIL provided on the second layer.

Figure 11:
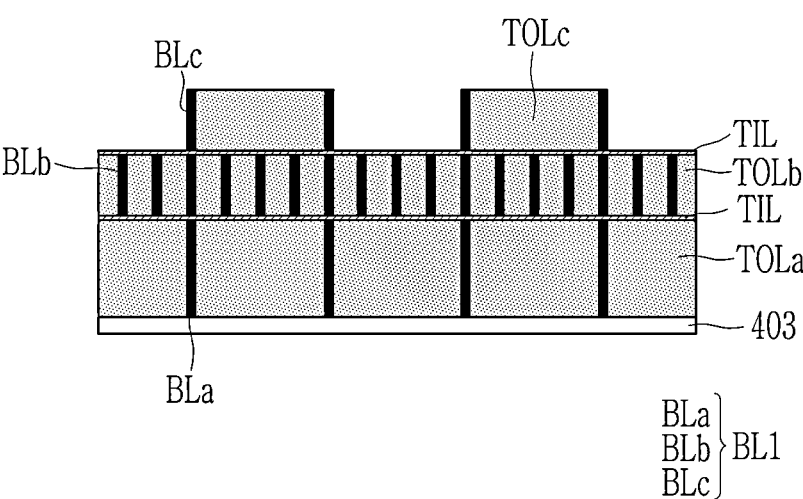

As shown in FIG. 11, the transparent organic material layer TOLm of the third layer may be patterned by using the photolithography process to thus form a third transparent organic film TOLc pattern. The third transparent organic film TOLc may have a width and extends in a direction, and adjacent third transparent organic film TOLc may be spaced by a distance. A width of the third transparent organic film TOLc and a distance between the third transparent organic films TOLc may be substantially the same.

The distance between the third transparent organic films TOLc and the distance between the first light blocking patterns BLa may be substantially the same. The third transparent organic films TOLc may overlap the first transparent organic films TOLa in a plan view. For example, the first transparent organic film TOLa pattern may be equivalent to the third transparent organic film TOLc pattern in a plan view.

A light blocking material layer for blocking light may be thinly applied along the pattern of the third transparent organic film TOLc, and a dry etching may be performed to form multiple third light blocking patterns BLc on side surfaces of the third transparent organic film TOLc. The light blocking material may include a light absorbing material. The light absorbing material may include a metal oxide such as $MoTaO_x$, $AlO_x$, $CrO_x$, $CuO_x$, $MoO_x$, $TiO_x$, $AlNdO_x$, $CuMoO_x$, or $MoTiO_x$. For example, the light blocking material layer may include MTO ($MoTaO_x$).

The third light blocking patterns BLc may overlap the first light blocking patterns BLa in a plan view to be coplanar with the first light blocking patterns BLa.

Figure 12:
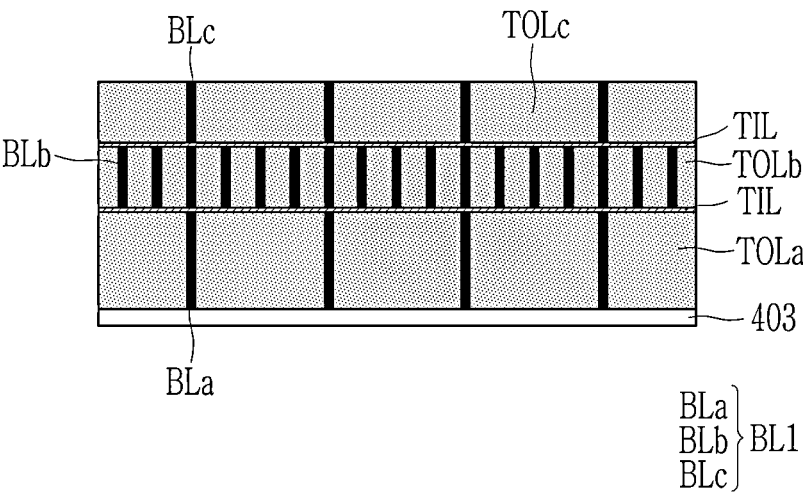

Referring to FIG. 12, a transparent organic material may be filled in a space between the third light blocking patterns BLc corresponding to the intervals between the third transparent organic films TOLc shown in FIG. 11 to thus complete the third layer. For example, the third layer may include third light blocking patterns BLc extending in a direction and disposed at intervals of a distance (third distance) in a direction intersecting the extending direction, and a third transparent organic film TOLc disposed between the third light blocking patterns BLc.

The distance (third distance) between the third light blocking patterns BLc and the distance (first distance) between the first light blocking patterns BLa may be substantially the same. The third light blocking patterns BLc may overlap the first light blocking patterns BLa in a plan view. For example, the first light blocking pattern BLa may be equivalent to the third light blocking pattern BLc in a plan view.

As described, the first light blocking patterns BLa, the second light blocking patterns BLb overlapping the first light blocking patterns, and the third light blocking patterns BLc overlapping the first light blocking patterns may be coplanar with each other to configure the main light blocking pattern BL1. The second light blocking patterns BLb that do not configure the main light blocking pattern BL1 may configure the sub-light blocking pattern BL2.

As described, according to the method for manufacturing a light controller, the transparent organic film configuring the light controller may be formed thick and the distance between the light blocking patterns may be reduced, thereby efficiently controlling the viewing angle.

Figure 13B:
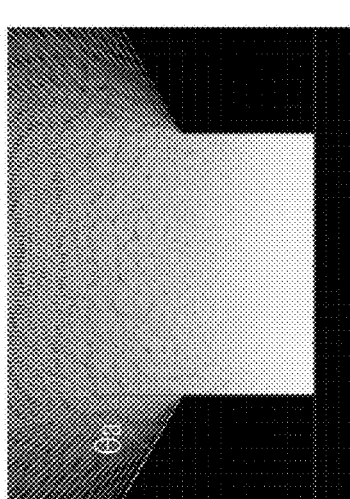
FIGS. 13A and 13B show schematic views of a light path in a light controller and a light emitting simulation according to a comparative example.
Figure 13A:
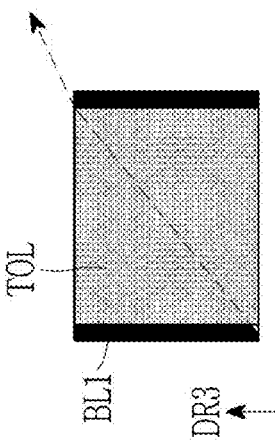
Figure 14A:
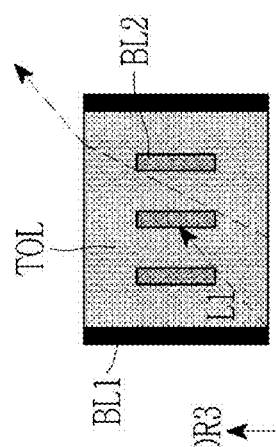
FIGS. 14A and 14B show schematic views of a light path in a light controller and a light emitting simulation according to an embodiment.
Figure 14B:
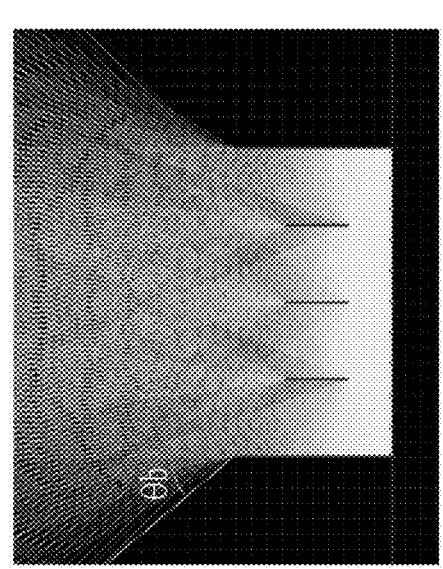

FIGS. 13A and 13B show a light emitting simulation of a light controller according to a comparative embodiment, and FIGS. 14A and 14B show a light emitting simulation of a light controller according to an embodiment.

FIG. 13A schematically illustrates a light path according to a comparative embodiment in which a main light blocking pattern BL1 is provided, and FIG. 13 B shows performance of a light emitting simulation according to a comparative embodiment.

FIG. 14A schematically illustrates a light path according to an embodiment in which a sub-light blocking pattern BL2 is disposed between main light blocking patterns BL1, and FIG. 14 B shows performance of a light emitting simulation according to an embodiment.

Comparing FIG. 13A and FIG. 14A and referring to the same, light emitting from a left corner passes through an upper portion of the main light blocking portion BL1 and is transmitted to a lateral side in FIG. 13A and the light L1 emitting from the left corner is blocked by the sub-light blocking pattern BL1 and is not transmitted in FIG. 14A. Hence, the light passing through the upper portion of the sub-light blocking pattern BL2 and transmitting to the lateral side may have a lateral light-emitting angle (θb) in FIG. 14B that is less than a lateral light-emitting angle (θa) according to a comparative embodiment in FIG. 14A.

Comparing FIG. 13 B and FIG. 14 B and referring to the same, the lateral light-emitting angle (θb) according to an embodiment in FIG. 14 B may be less than the lateral light-emitting angle (θa) according to a comparative embodiment in FIG. 13 B so the lateral viewing angle of the display device according to an embodiment may be narrower than the lateral viewing angle of the display device according to a comparative embodiment, thereby the lateral light blocking rate may be increased.

Figure 15:
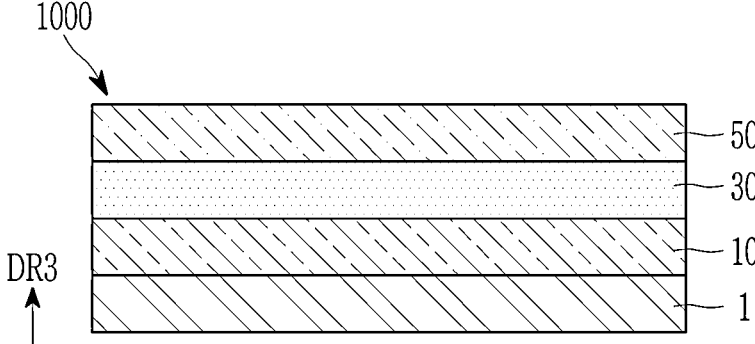
FIG. 15 shows a schematic cross-sectional view of a display device according to an embodiment.

A display device including a light controller according to an embodiment will now be described with reference to FIG. 15 and FIG. 16. FIG. 15 shows a schematic cross-sectional view of a display device according to an embodiment, and FIG. 16 shows a schematic cross-sectional view of a stacked structure of a display panel 1 according to an embodiment.

Referring to FIG. 15, the display device 1000 may include multiple light-emitting devices on a substrate, a display panel 1 including an encapsulation layer on the light-emitting devices, a light controller 10 disposed on the display panel 1, and an adhesive layer 30 and a window 50 disposed on the light controller 10. The adhesive layer 30 may be transparent, and may include an optical clear adhesive (OCA), an optical curable resin (OCR), or an ultraviolet resin.

Figure 16:
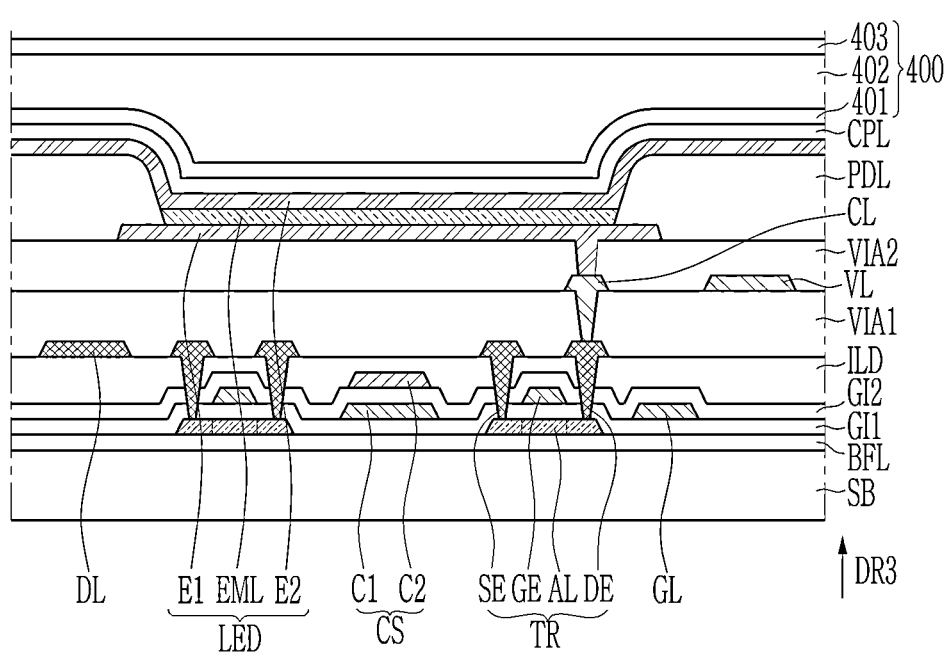
FIG. 16 shows a schematic cross-sectional view of a stacked structure of a display panel according to an embodiment.

FIG. 16 shows a schematic cross-sectional view of a stacked structure of a display panel 1 according to an embodiment. The cross-section shown in FIG. 16 may correspond to substantially one pixel area.

The display panel 1 may include a substrate SB, a transistor TR provided on the substrate SB, and a light-emitting device LED connected to the transistor TR. The light-emitting device LED may correspond to the pixel.

The substrate SB may be made of a material such as glass. The substrate SB may be a flexible substrate including a polymer resin such as a polyimide, a polyamide, or a polyethylene terephthalate.

A buffer layer BFL may be disposed on the substrate SB. The buffer layer BFL may block an impurity from the substrate SB and may improve a characteristic of a semiconductor layer in case that the semiconductor layer is formed, and may planarize a surface of the substrate SB and may ease a stress of the semiconductor layer. The buffer layer BFL may include an inorganic insulating material such as a silicon nitride ($SiN_x$), a silicon oxide ($SiO_x$), or a silicon oxynitride ($SiO_xN_y$), and may be a single layer or a multi-layer. The buffer layer BFL may include amorphous silicon (Si).

A semiconductor layer AL of the transistor TR may be disposed on the buffer layer BFL. The semiconductor layer AL may include a first region, a second region, and a channel region between the first and second regions. The semiconductor layer AL may include at least one of amorphous silicon, polysilicon, and an oxide semiconductor. For example, the semiconductor layer AL may include a low temperature polysilicon (LTPS) or an oxide semiconductor material including at least one of zinc (Zn), indium (In), gallium (Ga), and tin (Sn). For example, the semiconductor layer AL may include an indium-gallium-zinc oxide (IGZO).

A first gate insulating layer GI1 may be disposed on the semiconductor layer AL. The first gate insulating layer GI1 may include an inorganic insulating material such as a silicon nitride, a silicon oxide, or a silicon oxynitride, and may be a single layer or a multilayer.

A first gate conductive layer including a gate electrode GE of the transistor TR, a gate line GL, and a first electrode C1 of a capacitor CS may be disposed on the first gate insulating layer GI1. The first gate conductive layer may include at least one of molybdenum (Mo), aluminum (Al), copper (Cu), and titanium (Ti), and may be a single layer or a multilayer.

A second gate insulating layer GI2 may be disposed on the first gate conductive layer. The second gate insulating layer GI2 may include an inorganic insulating material such as a silicon nitride, a silicon oxide, or a silicon oxynitride, and may be a single layer or a multilayer.

A second gate conductive layer including a second electrode C2 of the capacitor CS may be disposed on the second gate insulating layer GI2. The second gate conductive layer may include at least one of molybdenum (Mo), aluminum (Al), copper (Cu), and titanium (Ti), and may be a single layer or a multilayer.

An inter-layer insulating layer ILD may be disposed on the second gate insulating layer GI2 and the second gate conductive layer. The inter-layer insulating layer ILD may include an inorganic insulating material such as a silicon nitride, a silicon oxide, or a silicon oxynitride, and may be a single layer or a multilayer.

A first data conductive layer including a first electrode SE and a second electrode DE of the transistor TR, and a data line DL may be disposed on the inter-layer insulating layer ILD. The first electrode SE and the second electrode DE may be respectively connected to the first region and the second region of the semiconductor layer AL through contact holes of the insulating layers GI1, GI2, and ILD. One of the first electrode SE and the second electrode DE may be a source electrode and another one of the first electrode SE and the second electrode DE may be a drain electrode. The first data conductive layer may include at least one of aluminum (Al), platinum (Pt), palladium (Pd), silver (Ag), magnesium (Mg), gold (Au), nickel (Ni), neodymium (Nd), iridium (Ir), chromium (Cr), nickel (Ni), calcium (Ca), molybdenum (Mo), titanium (Ti), tungsten (W), and copper (Cu), and may be a single layer or a multilayer.

A first planarization layer VIA1 may be disposed on the first data conductive layer. The first planarization layer VIA1 may be an organic insulating layer. For example, the first planarization layer VIA1 may include an organic insulating material such as a general-purpose polymer including poly (methyl methacrylate) and polystyrene, a polymer derivative having a phenol-based group, an acryl-based polymer, an imide-based polymer (e.g., a polyimide), or a siloxane-based polymer.

A second data conductive layer including a voltage line VL and a connection line CL may be disposed on the first planarization layer VIA1. The voltage line VL may transmit voltages such as a driving voltage, a common voltage, an initialization voltage, or a reference voltage. The connection line CL may be connected to the second electrode DE of the transistor TR through a contact hole of the first planarization layer VIA1. The second data conductive layer may include at least one of aluminum (Al), platinum (Pt), palladium (Pd), silver (Ag), magnesium (Mg), gold (Au), nickel (Ni), neodymium (Nd), iridium (Ir), chromium (Cr), nickel (Ni), calcium (Ca), molybdenum (Mo), titanium (Ti), tungsten (W), and copper (Cu), and may be a single layer or a multilayer.

A second planarization layer VIA2 may be disposed on the second data conductive layer. The second planarization layer VIA2 may be an organic insulating layer. For example, the second planarization layer VIA2 may include an organic insulating material such as a general-purpose polymer including poly(methyl methacrylate) and polystyrene, a polymer derivative having a phenol-based group, an acryl-based polymer, an imide-based polymer, a polyimide, or a siloxane-based polymer.

A first electrode E1 of the light-emitting device LED may be disposed on the second planarization layer VIA2. The first electrode E1 may be referred to as a pixel electrode. The first electrode E1 may be connected to the connection line CL through a contact hole of the second planarization layer VIA2. Therefore, the first electrode E1 may be electrically connected to the second electrode DE of the transistor TR and may receive a data signal for controlling luminance of the light-emitting device. The transistor TR connected to the first electrode E1 may be a driving transistor or a transistor electrically connected to the driving transistor. The first electrode E1 may be made of a reflective conductive material, a semi-transmissive conductive material, or a transparent conductive material. The first electrode E1 may include a transparent conductive material such as an indium tin oxide (ITO) or an indium zinc oxide (IZO). The first electrode E1 may include a metal such as lithium (Li), calcium (Ca), aluminum (Al), silver (Ag), magnesium (Mg), or gold (Au), or a metal alloy.

A pixel defining layer PDL that may be an organic insulating layer may be disposed on the second planarization layer VIA2. The pixel defining layer PDL may be referred to as a cell barrier, and may have an opening overlapping the first electrode E1 in the third direction DR3.

An emission layer EML of the light-emitting device LED may be disposed on the first electrode E1. At least one of a hole injection layer, a hole transfer layer, an electron injection layer, and an electron transfer layer in addition to the emission layer EML may be disposed on the first electrode E1.

A second electrode E2 of the light-emitting device LED may be disposed on the emission layer EML. The second electrode E2 may be referred to as a common electrode. The second electrode E2 may be made a thin layer with a metal having a low work function such as calcium (Ca), barium (Ba), magnesium (Mg), aluminum (Al), or silver (Ag), or a metal alloy thereof, thereby having light transmission. The second electrode E2 may include a transparent conductive oxide such as an indium tin oxide (ITO) or an indium zinc oxide (IZO).

The first electrode E1, the emission layer EML, and the second electrode E2 of each pixel configure a light-emitting device LED such as an organic light emitting element. The first electrode E1 may be an anode of the light-emitting device, and the second electrode E2 may be a cathode of the light-emitting device.

A capping layer CPL may be disposed on the second electrode E2. The capping layer CPL may increase light efficiency by adjusting a refractive index. The capping layer CPL may entirely cover the second electrode E2. The capping layer CPL may include an organic insulating material, and may include an inorganic insulating material.

An encapsulation layer 400 may be disposed on the capping layer CPL. The encapsulation layer 400 may encapsulate the light-emitting device LED to prevent permeation of moisture or oxygen from the outside. The encapsulation layer 400 may be a thin film encapsulation layer including at least one of inorganic films 401 and 403 and at least one organic film 402.

The light controller 10 may be disposed on the encapsulation layer 400 of the display panel 1. Light emitted by the emission layer EML of the display panel 1 may pass through the light controller 10 and the window 50 and may be visible to the user. Light emitted between the light blocking patterns BL of the light controller 10 greater than an angle with respect to a direction that is perpendicular to the window 50 may be blocked.

Although not shown, a sensing insulating layer and multiple sensing electrodes for sensing user's input may be further disposed between the encapsulation layer 400 and the light controller 10.

Many effects of the display device including a light controller according to an embodiment will now be described with reference to FIG. 17 to FIG. 19.

Figure 17:
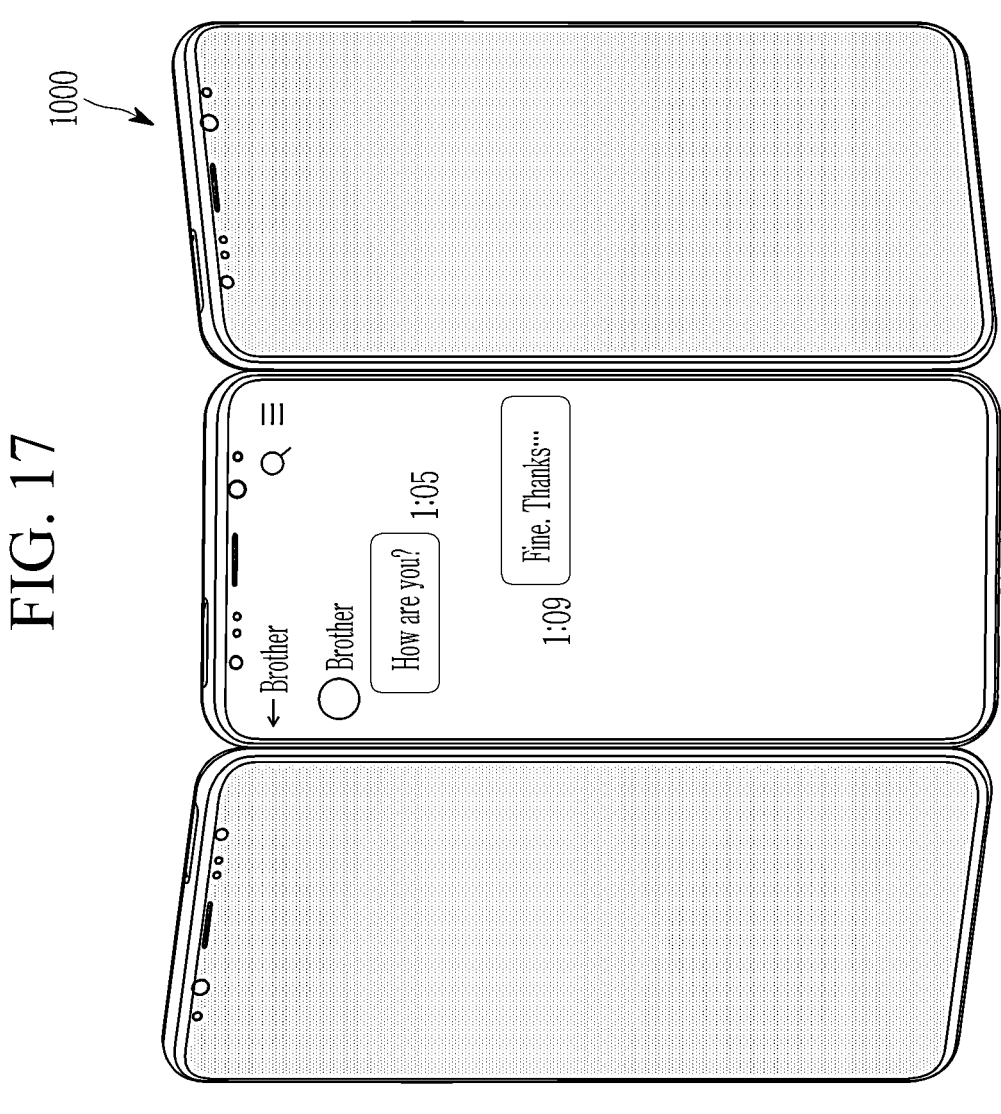
FIG. 17 shows a display device seen from different angles according to an embodiment.

FIG. 17 shows a display device seen from different angles according to an embodiment.

Referring to FIG. 17, the display device 1000 may display images to the user in a direction in which the user faces the display device 1000, and the images may not be seen in a direction greater than an angle. According to this, the display device 1000 may provide a privacy function for protecting information displayed on the screen from others in public places.

Figure 18:
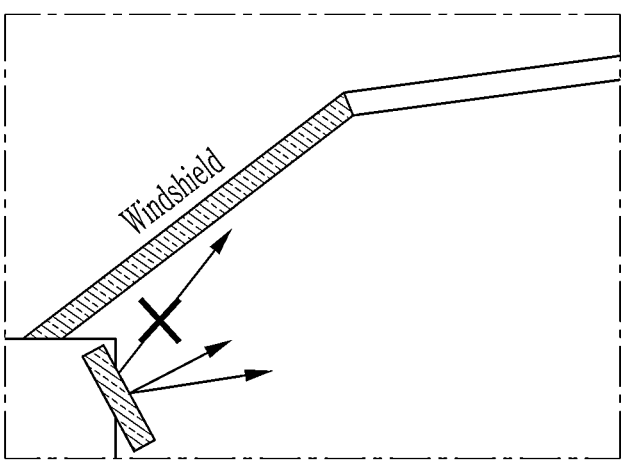
FIG. 18 shows a light path emitted by a display device according to an embodiment.
Figure 19:
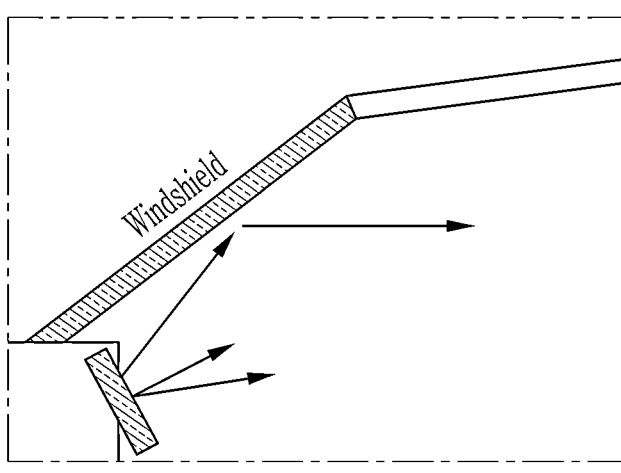
FIG. 19 shows a light path emitted by a display device according to a comparative example.

FIG. 18 and FIG. 19 show cases in which a display device according to an embodiment is applied to a vehicle. FIG. 18 shows a light path emitted by a display device according to an embodiment, and FIG. 19 shows a light path emitted by a display device according to a comparative embodiment.

As shown in FIG. 18, in the case of the display device including a light controller, light emitted toward a vehicle windowpane (e.g., a windshield) may be blocked from the display device. Therefore, the light emitted from the display device may be prevented from being reflected at the vehicle windshield. The reflected images may not be generated and safety of the driver may be obtained by blocking the light transmitting toward the vehicle windshield.

However, in case that the light controller is not included, as shown in FIG. 19, the light emitted by the display device may be transmitted in various angles and some of the light may be transmitted toward the vehicle windshield and may be seen to the user as the reflected image.

The above description is an example of technical features of the disclosure, and those skilled in the art to which the disclosure pertains will be able to make various modifications and variations. Thus, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A display device comprising:
a light-emitting device disposed on a substrate and including an emission layer; and
a light controller disposed on the light-emitting device, wherein
the light controller includes:
   a plurality of main light blocking patterns extending in a first direction and spaced apart from each other in a second direction intersecting the first direction;
   a transparent organic film disposed in spaces between adjacent ones of the plurality of main light blocking patterns in the second direction; and
   a plurality of sub-light blocking patterns disposed in the transparent organic film, extending in the first direction, and spaced apart from each other in the second direction,
each of the plurality of main light blocking patterns has a first thickness in a thickness direction of the substrate, and
each of the plurality of sub-light blocking patterns has a second thickness that is less than the first thickness in the thickness direction of the substrate.

2. The display device of claim 1, wherein the first thickness is equal to or greater than twice the second thickness.

3. The display device of claim 1, wherein
the plurality of main light blocking patterns are spaced apart from each other by a first distance,
the plurality of sub-light blocking patterns are spaced apart from each other by a second distance, and
the first distance is greater than the second distance.

4. The display device of claim 1, wherein a distance between an upper surface of the emission layer and a bottom surface of each of the plurality of sub-light blocking patterns is greater than a distance between the upper surface of the emission layer and a bottom surface of each of the plurality of main light blocking patterns.

5. The display device of claim 1, wherein a number of the plurality of sub-light blocking patterns is greater than a number of the plurality of main light blocking patterns.

6. The display device of claim 1, wherein at least one of the plurality of main light blocking patterns and the plurality of sub-light blocking patterns includes at least one of $MoTaO_x$, $AlO_x$, $CrO_x$, $CuO_x$, $MoO_x$, $TiO_x$, $AlNdO_x$, $CuMoO_x$, and $MoTiO_x$.

7. An electronic device comprising:
a display device including:
a light-emitting device disposed on a substrate and including an emission layer; and
a light controller disposed on the light-emitting device, wherein the light controller includes:
   a first layer including a plurality of first light blocking patterns extending in a first direction and spaced apart from each other by a first distance in a second direction intersecting the first direction;
   a second layer disposed on the first layer and including a plurality of second light blocking patterns extending in the first direction and spaced apart from each other by a second distance in the second direction; and
a third layer disposed on the second layer and including a plurality of third light blocking patterns extending in the first direction and spaced apart from each other by a third distance in the second direction,
at least one of the first distance, the second distance, and the third distance is different from another one of the first distance, the second distance, and the third distance, and
wherein the third distance and the first distance are equal.

8. The electronic device of claim 7, further comprising:
a first transparent organic film disposed on the emission layer between the plurality of first light blocking patterns;
a second transparent organic film disposed on the first transparent organic film between the plurality of second light blocking patterns; and
a third transparent organic film disposed on the second transparent organic film between the plurality of third light blocking patterns.

9. The electronic device of claim 8, wherein a thickness of the second transparent organic film is less than a thickness of the first transparent organic film in a thickness direction of the substrate.

10. The electronic device of claim 7, wherein at least a part of the plurality of second light blocking patterns overlaps at least a part of the plurality of first light blocking patterns and at least a part of the plurality of third light blocking patterns in a plan view.

11. A method for manufacturing a display device, comprising:
providing a first layer including first transparent organic films and a plurality of first light blocking patterns disposed between the first transparent organic films on an encapsulation layer of a substrate;
providing a second layer including second transparent organic films and a plurality of second light blocking patterns disposed between the second transparent organic films on the first layer; and
providing a third layer including third transparent organic films and a plurality of third light blocking patterns disposed between the third transparent organic films on the second layer,
wherein at least one of a first distance between adjacent ones of the plurality of first light blocking patterns, a second distance between adjacent ones of the plurality of second light blocking patterns, and a third distance between adjacent ones of the plurality of third light blocking patterns is different from another one of the first distance, the second distance, and the third distance, and
wherein the providing of the first layer includes:
   providing the first transparent organic films by applying and patterning a transparent organic material;
   applying a light blocking material on the first transparent organic films;
   forming the plurality of first light blocking patterns by dry etching the light blocking material; and
   filling a space between the plurality of first light blocking patterns with the transparent organic material.

12. The method of claim 11, further comprising:
providing an inorganic layer on the first layer before the providing of the second layer.

13. The method of claim 11, wherein at least a part of the plurality of second light blocking patterns overlaps at least a part of the plurality of first light blocking patterns and at least a part of the plurality of third light blocking patterns in a plan view.

14. The method of claim 13, wherein each of the plurality of first light blocking patterns overlaps one of the plurality of third light blocking patterns in a plan view.

15. The method of claim 11, wherein the second distance is less than the first distance.

16. The method of claim 11, wherein the third distance and the first distance are equal.

17. The method of claim 11, wherein a thickness of each of the second transparent organic films is less than a thickness of each of the first transparent organic films in a thickness direction of the substrate.

* * * * *